United States Patent
Ottens et al.

(10) Patent No.: US 7,307,688 B2
(45) Date of Patent: Dec. 11, 2007

(54) CLAMPING DEVICE FOR OPTICAL ELEMENTS, LITHOGRAPHIC APPARATUS WITH OPTICAL ELEMENTS IN A CLAMPING DEVICE, AND METHOD FOR MANUFACTURING SUCH APPARATUS

(75) Inventors: Cornelis Christiaan Ottens, Veldhoven (NL); Erik Maria Rekkers, Boxtel (NL)

(73) Assignee: ASML Netherlands B.V., Veldhoven (NL)

( * ) Notice: Subject to any disclaimer, the term of this patent is extended or adjusted under 35 U.S.C. 154(b) by 125 days.

(21) Appl. No.: 10/992,233

(22) Filed: Nov. 19, 2004

(65) Prior Publication Data

US 2006/0109439 A1 May 25, 2006

(51) Int. Cl.
*G03B 27/42* (2006.01)
*G02B 7/02* (2006.01)
(52) U.S. Cl. ......................... 355/53; 359/819
(58) Field of Classification Search ............. 355/53, 355/67; 359/811, 818, 819, 871
See application file for complete search history.

(56) References Cited

U.S. PATENT DOCUMENTS

| | | | |
|---|---|---|---|
| 6,386,719 B1* | 5/2002 | Lee ........................... | 359/879 |
| 2002/0191654 A1* | 12/2002 | Klene et al. ................. | 372/25 |
| 2003/0147160 A1* | 8/2003 | Endoh et al. ............... | 359/838 |
| 2003/0211297 A1* | 11/2003 | Rossing et al. .......... | 428/195.1 |
| 2004/0218289 A1* | 11/2004 | Kino et al. ................. | 359/819 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus arranged to transfer a pattern from a patterning device onto a substrate. The apparatus includes an optical element, and at least two clamping assemblies for clamping the optical element. The clamping assemblies each include a first clamp with a first clamping surface in contact with a first surface of the optical element and a second clamp with a second clamping surface in contact with a second surface of said optical element, opposite said first surface of said optical element.

44 Claims, 11 Drawing Sheets

CLAMPING DEVICE FOR OPTICAL ELEMENTS, LITHOGRAPHIC APPARATUS WITH OPTICAL ELEMENTS IN A CLAMPING DEVICE, AND METHOD FOR MANUFACTURING SUCH APPARATUS

FIELD

The present invention relates to an optical assembly, especially for a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In lithographic apparatus, various optical elements are provided, especially very thin and fragile optical elements. These elements should be positioned accurately and in a fixed position.

Presently known methods for positioning optical elements include frames in which the elements may be contained. The frames are often provided with connecting elements for fixture to, for example, a frame of the apparatus. Such frames often need a relatively large amount of material and volume for positioning and fixture.

Furthermore, it is known to use adhesives for fixing optical elements in an apparatus. This is undesirable because of potential contamination of the optical element and its surroundings. Chemical elements may be released from the adhesive, especially when it is excited by radiation, for example, a light beam, during use of the apparatus.

SUMMARY

It is an aspect of the present invention to provide an improved apparatus that has optical elements. More specifically, it is an aspect of the present invention to provide a lithographic apparatus that has optical elements that are positioned and fixed in the apparatus in an improved manner.

A further aspect of the present invention is to provide a clamping device for optical elements. Especially for thin and fragile optical elements, such as mirrors or lenses, in lithographic apparatus, it is desirable to provide a clamping device that provides sufficient clamping force for holding an optical element in a fixed position, without deformation of the optical element due to the clamping.

A still further aspect of the present invention is to provide an improved method for manufacturing an apparatus that has at least one optical element. It is desirable to provide a method for robust and easy fixation of an optical element in such apparatus, without deformation of the optical element, and without the necessity of using adhesives.

A further aspect of the present invention is to provide a new use of clamping devices for optical elements.

According to an embodiment of the present invention, there is provided a lithographic apparatus arranged to transfer a pattern from a patterning device onto a substrate. The apparatus includes an optical element, and at least two clamping assemblies for clamping the optical element. The clamping assemblies each include a first clamp with a first clamping surface in contact with a first surface of the optical element and a second clamp with a second clamping surface in contact with a second surface of the optical element, opposite the first surface of the optical element, a support connected to the first clamp and the second clamp so that the first and second clamps are positioned facing each other, a first guide constructed and arranged to allow the first clamp to move in a first direction substantially perpendicular to the first surface of the optical element and to constrain the first clamp against movement in directions perpendicular to the first direction, and a plurality of locking pins for forcing the first clamping surface of the first clamp against the first surface of the optical element, and the second clamping surface of the optical element against the opposing second surface of the second clamp.

In such a lithographic apparatus according to the present invention, the optical element may clamped by at least two clamping assemblies, thereby positively fixating the optical element in a fixed position. Due to the positioning of the first and second surface of the first and second clamps in the clamping assemblies, the optical element may be held in position with a relatively low clamping force. No adhesives are needed for such clamping. Therefore, a light beam of a relevant light source should not be influenced by any pollution of the atmosphere around the optical element, which might otherwise occur due to such adhesive.

According to an embodiment of the invention, there is provided an apparatus An apparatus including an optical element, the optical element being clamped by at least two clamping assemblies for clamping the optical element, the clamping assemblies each including a first clamp with a first clamping surface in contact with a first surface of the optical element and a second clamp with a second clamping surface in contact with a second surface of the optical element, opposite the first surface of the optical element, a support connected to the first clamp and the second clamp so that the first and second clamps are positioned facing each other, a first guide constructed and arranged to allow the first clamp to move in a first direction substantially perpendicular to the first surface of the optical element and to constrain the first clamp against movement in directions perpendicular to the first direction, and a plurality of locking pins for forcing the first clamping surface of the first clamp against the first surface of the optical element, and the second clamping surface of the optical element against the opposing second surface of the second clamp.

In such an apparatus according to the present invention, an optical element may be clamped in an easy and positive manner, thereby preventing movement of the optical element relative to the clamping assemblies. The clamping assemblies may hold the optical element with a relatively low clamping force, while still providing protection to an optical element to high translational and rotational accelerations and decelerations.

According to an embodiment of the present invention there is provided a clamping device for an optical element. The clamping device includes at least two clamping assemblies for clamping the optical element. The clamping assemblies each include a first clamp with a first clamping surface in contact with a first surface of the optical element and a second clamp with a second clamping surface in contact with a second surface of the optical element, opposite the first surface of the optical element, a support connected to the first clamp and the second clamp so that the first and second clamps are positioned facing each other, a first guide constructed and arranged to allow the first clamp to move in a first direction substantially perpendicular to the first surface of the optical element and to constrain the first clamp against movement in directions perpendicular to the first direction, and a plurality of locking pins for forcing the first clamping surface of the first clamp against the first surface of the optical element, and the second clamping surface of the optical element against the opposing second surface of the second clamp.

Such a device according to the present invention may be used for fixating optical elements without the need for adhesives. Even relatively thin and fragile optical elements, such as those made of $CaF_2$, that have a thickness of a few millimeters or less may be clamped in such a device with a relatively low clamping force. The device may be used for both shipping of an optical element, due to its resistance to high accelerations and decelerations, and for positioning optical elements in an apparatus, for example, a lithographic apparatus according to the present invention.

In an embodiment, a clamping device according to the present invention has at least two clamping assemblies positioned beside each other, such that one optical element may be clamped in the clamping devices near one side edge, especially one longitudinal side edge of the optical element, such that no further clamping assemblies or other supports for the optical elements have to be provided opposite the clamping assemblies. This may lead to very small volumes of such devices and prevent obstruction of light beams traveling past the optical element opposite the clamping assemblies.

In an embodiment of the present invention, there is provided method for manufacturing a device that includes an optical element for an apparatus. The method includes clamping the optical element with at least two clamping assemblies, each clamping assembly including a first clamp with a first clamping surface which is brought into contact with a first surface of the optical element and a second clamp with a second clamping surface which is brought into contact with a second surface of the optical element, opposite the first surface of the optical element, positioning the first clamp such that it can move in a first direction substantially perpendicular to the first surface of the optical element but is constrained against movement in directions perpendicular to the first direction, and forcing locking pins against the first clamps to force the first clamping surface of the first clamp against the first surface of the optical element and the second surface of the optical element against the opposing second clamping surface of the second clamp.

In such method according to the present invention, an optical element may be easily positioned in a fixed configuration, without the need for adhesives. The optical element may be clamped using relatively low clamping forces, thereby resulting in the possibility of clamping relatively thin and fragile optical elements without relevant deformations to the optical element, and without relevant stress induced in the optical element due to the clamping.

Manufacturing is understood to include both novel construction of an apparatus, or parts thereof, and repair and maintenance of such an apparatus, or parts thereof. Relevant deformations and relevant stresses to an optical element should be understood as encompassing at least such deformations to the optical element and/or stresses induced in the optical element that light beams falling onto or through the optical element are deflected or otherwise interfered with to such extend that the specifications of the apparatus in which the optical element is to be used are not met during normal use.

In an embodiment of the invention, a use of the aforementioned clamping device for an optical element is provided for shipping at least one optical element clamped in the clamping assemblies of the clamping device.

According to the present invention, a clamping device may be used to package and ship at least one optical element to an apparatus in which it is to be used, for example, as replacement for a similar element. The device may be used for positioning and fixating the optical element when being introduced into the apparatus.

An embodiment of the invention provides a unit for providing a light beam. The unit includes a light source and a pulse stretcher. The pulse stretcher includes an optical element for deflecting at least part of a light beam provided by the light source. The optical element is clamped in a clamping device that includes at least two clamping assemblies for clamping the optical element. The clamping assemblies each include a first clamp with a first clamping surface in contact with a first surface of the optical element and a second clamp with a second clamping surface in contact with a second surface of the optical element, opposite the first surface of the optical element, a support connected to the first clamp and the second clamp so that the first and second clamps are positioned facing each other, a first guide constructed and arranged to allow the first clamp to move in a first direction substantially perpendicular to the first surface of the optical element and to constrain the first clamp against movement in directions perpendicular to the first direction, and a plurality of locking pins for forcing the first clamping surface of the first clamp against the first surface of the optical element, and the second clamping surface of the optical element against the opposing second surface of the second clamp.

In such a unit, at least one optical element may be clamped in position in an easy and sturdy manner, without the need for adhesives, and with relatively low clamping forces. Even relatively thin and/or fragile optical elements may therefore be positioned in such unit, without relevant deformations or stresses induced therein.

BRIEF DESCRIPTION OF THE DRAWINGS

Embodiments of the invention will now be described, by way of example only, with reference to the accompanying schematic drawings, in which corresponding reference symbols indicate corresponding parts, and in which.

DETAILED DESCRIPTION

Figure 1:
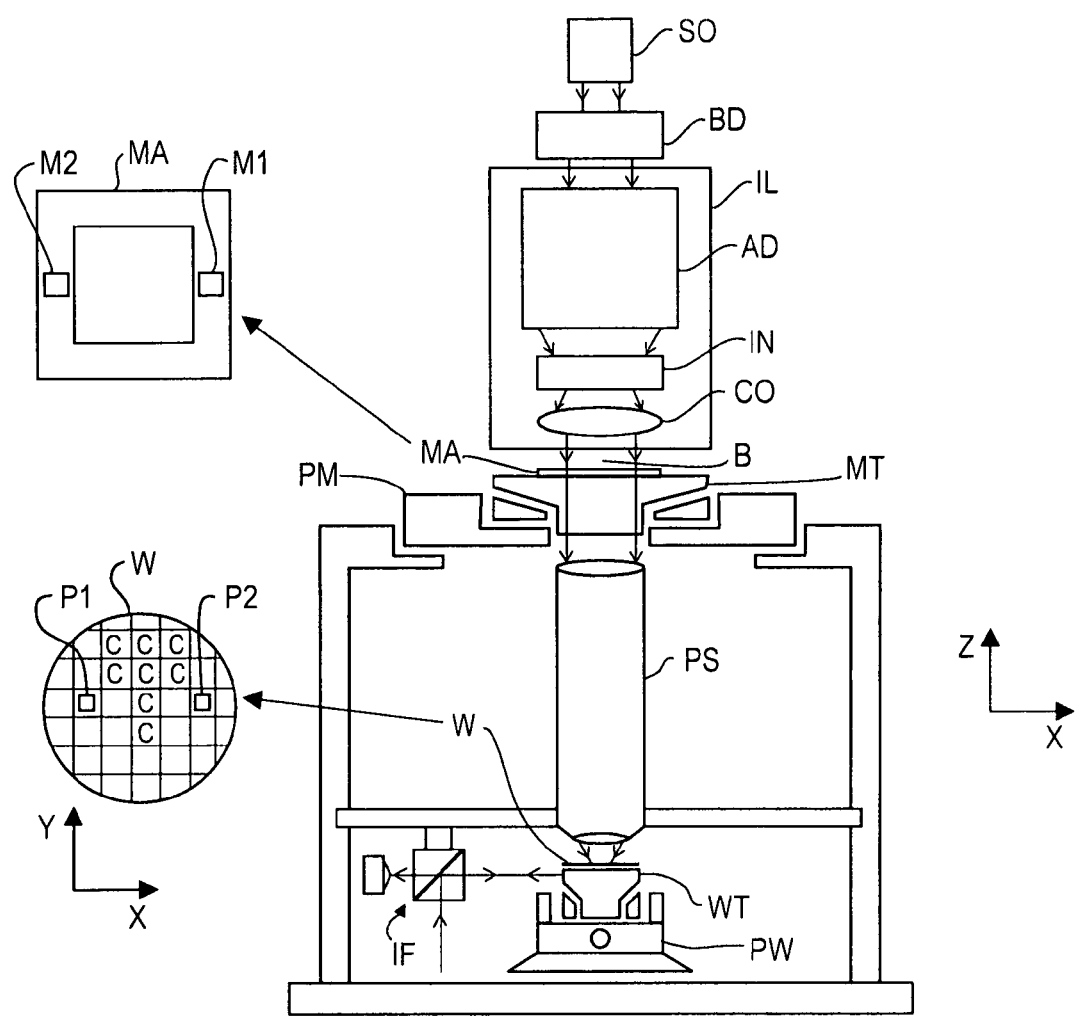
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as whether or not the patterning device is held in a vacuum environment. The support structure may use mechanical, vacuum, electrostatic or other clamping techniques to hold the patterning device. The support structure MT may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source does not have to be considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously, while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally, a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A unit for delivering a light beam, to be used in a lithographic apparatus, can be part of the source SO or of the beam delivery system BD. Such a unit may include a pulse stretcher PSt that includes a series of optical elements as will, by way of example, be shown in and further described in relation to FIGS. 2-5. In the pulse stretcher PSt, a light beam from a light source, especially a laser (not shown) such as an excimer laser giving pulses, is modified in intensity and duration of the pulse by redirecting part of the light beam within the pulse stretcher PSt.

Figure 2A:
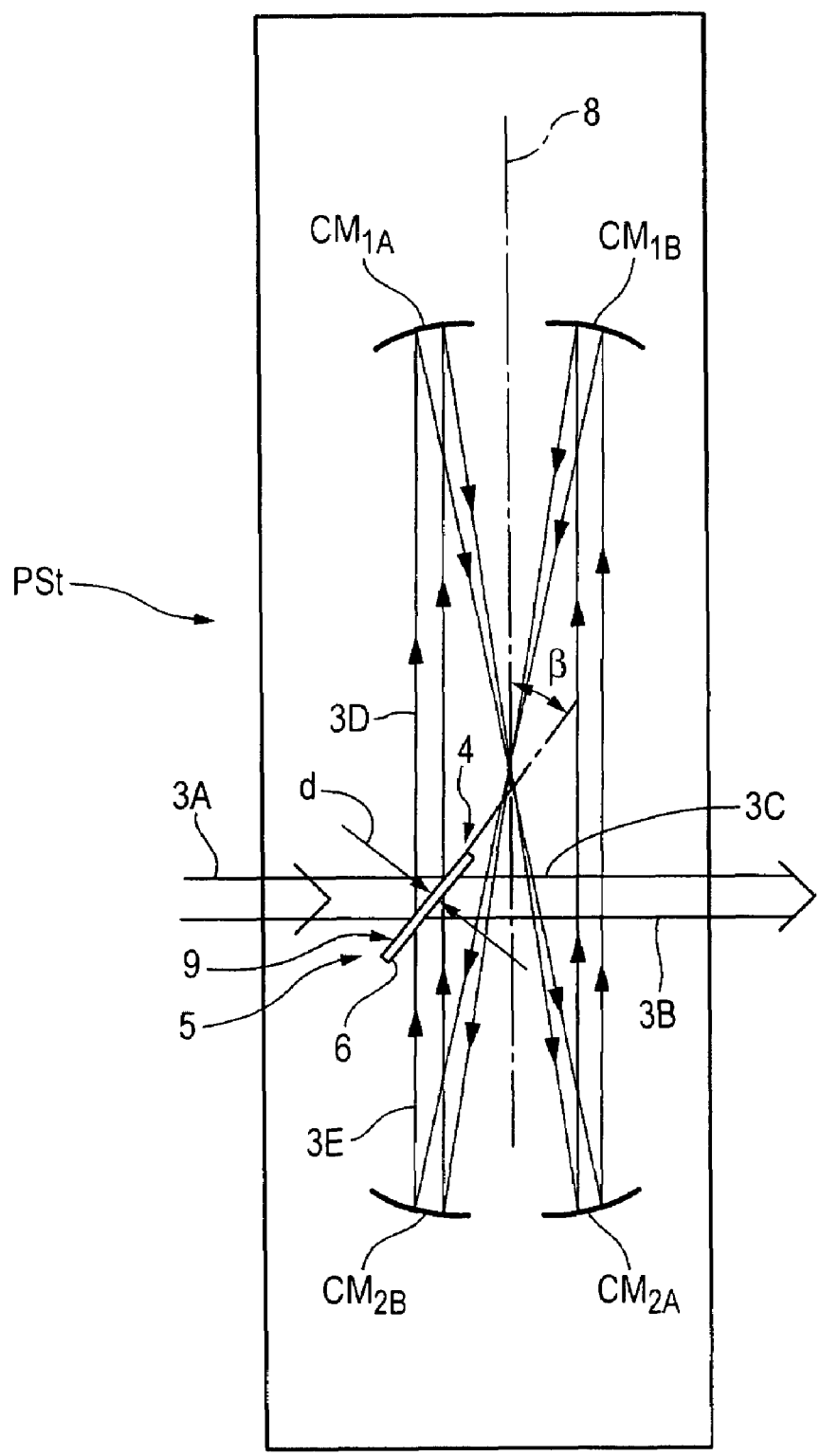
FIGS. 2A and B schematically depict the configuration of one embodiment of the optical configuration of a pulse stretcher, in a frontal and perspective side view, respectively.

As is shown in FIGS. 2A and B, in the pulse stretcher PSt, a beam splitter 5 is positioned between a first pair of concave mirrors $CM_1$ and a second pair of concave mirrors $CM_2$ The concave mirrors have reflecting surfaces which are substantially identical and are facing each other. In the embodiment shown, the beam splitter 5 is provided with a first optical element 6, which in this embodiment is in the form of a mirror that is semi-transparent to a light beam 3A from the light source SO. The optical element 6 in the embodiment shown is a flat mirror made of $CaF_2$ that typically has a thickness d of a few millimeters or less, and a surface area perpendicular to the thickness which is significantly larger. By way of example, which should not be considered to limit the invention, the thickness d may, for example, be approximately 3 mm, whereas the surface area may be approximately 74 mm by 56 mm (length x width). The optical element 6 is clamped such that a main surface 9 extends perpendicular to the thickness d, the main surface 9 including an angle β relative to an optical axis 8 common to the two pairs of concave mirrors $CM_1$ and $CM_2$. In the embodiment shown angle β is about 45°.

During use, a light beam 3A is, as a pulse, provided to the optical element 6 within a beam splitter 5. The beam 3A is partly, for example 50%, passed through the optical element 6, indicated by arrow 3C, whereas the rest of the beam 3, indicated by arrow 3D, is deflected onto a first mirror CM1A of the pair of mirrors $CM_1$ and reflected towards a first mirror $CM_{2A}$ of the second pair of concave mirrors $CM_2$ passing the beam splitter 5, also referred to as the beam splitting module 5. The beam so reflected is reflected by the second mirrors $CM_{1B}$, $CM_{2B}$ of each of the pairs of concave mirrors, past a second side 4 of the beam splitter 5 and is finally led back indicated by arrow 3E back to the optical element 6 to be deflected out of the pulse stretcher PSt towards the illuminator IL, together with the part 3C of the light beam 3 falling straight through the optical element 6. The light beam leaving the pulse stretcher is referred to as beam 3B. Due to the deflection of part of the light falling on the optical element 6 and passing straight through of the rest of the light falling on the optical element 6, the intensity of the light pulse of the incoming light beam 3A is modified, especially lowered, whereas the duration of the pulse 3B leaving the pulse stretcher is longer than that of the incoming light beam 3A.

Figure 2B:
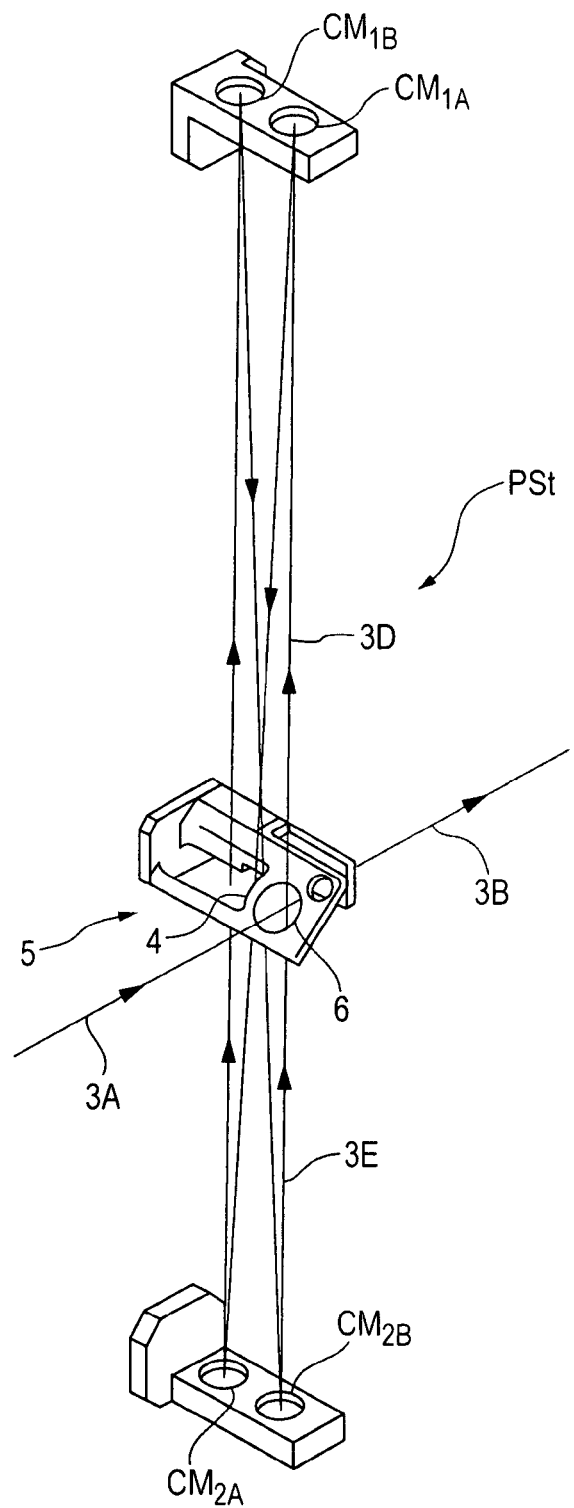

It should be clear that the representation of the re- and deflections of the various parts of the light beam 3A in FIGS. 2A and 2B, and the accompanying description are a strong simplification of the actual pattern within a pulse stretcher. Moreover, more optical elements may be provided, as for example shown in FIGS. 3-6.

Figure 3:
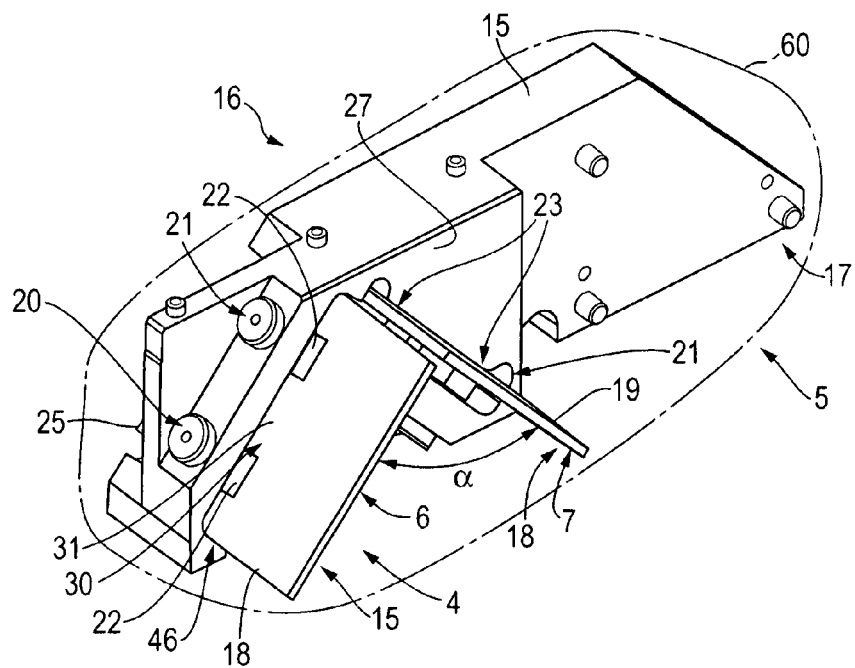
FIG. 3 is a perspective view of a clamping device according to an embodiment of the present invention, in the form of a beam splitting unit, that includes two optical elements.

FIG. 3 shows in perspective view from above a clamping device for optical elements according to the present invention, especially in the form of a beam splitter assembly 5. The beam splitter assembly 5 includes a support 15 having a back side 16 and an opposite front side 17. At the front side, two optical elements 6, 7 are provided, at a relative angle α. The optical elements 6, 7 are shown as flat mirrors (beamsplitters) having a thickness d, a first surface 18 and a second, opposite surface 19. Each optical element 6, 7 is clamped by a first clamping assembly 20 and second clamping assembly 21 connected to the support 15. The support 15 preferably is a common support to the first and second clamping assembly 20, 21 for each respective optical element 6, 7 and more preferably a common support to all clamping assemblies 20, 21 of the beam splitter assembly 5.

Each first and second clamping assembly 20, 21 includes a first clamp 22 and a second clamp 23. Since these are identical in construction and only differ in positioning, only one of a first and second clamping assembly will be discussed herein. Each first clamp 22 includes a first clamping surface 24 in contact with the first surface 18 of an optical element 6 or 7, whereas each second clamp 23 has a second clamping surface 25 in contact with the second surface 19 of an optical element 6 or 7. Of each clamping assembly, the relevant first and second clamping surface 24, 25 are directly opposite to each other, as shown more clearly in FIG. 4.

The second clamps 23 are stationary and connected to the support 15 by a first supporting beam 26, such that they extend substantially perpendicular to a frontal surface 27 of the support 15. The second clamping surfaces 25 are elevated relative to an intermediate part 28 of the supporting beam 26 over a similar height, such that these are level to each other, as is more clearly shown in FIGS. 5 and 6.

Figure 6:
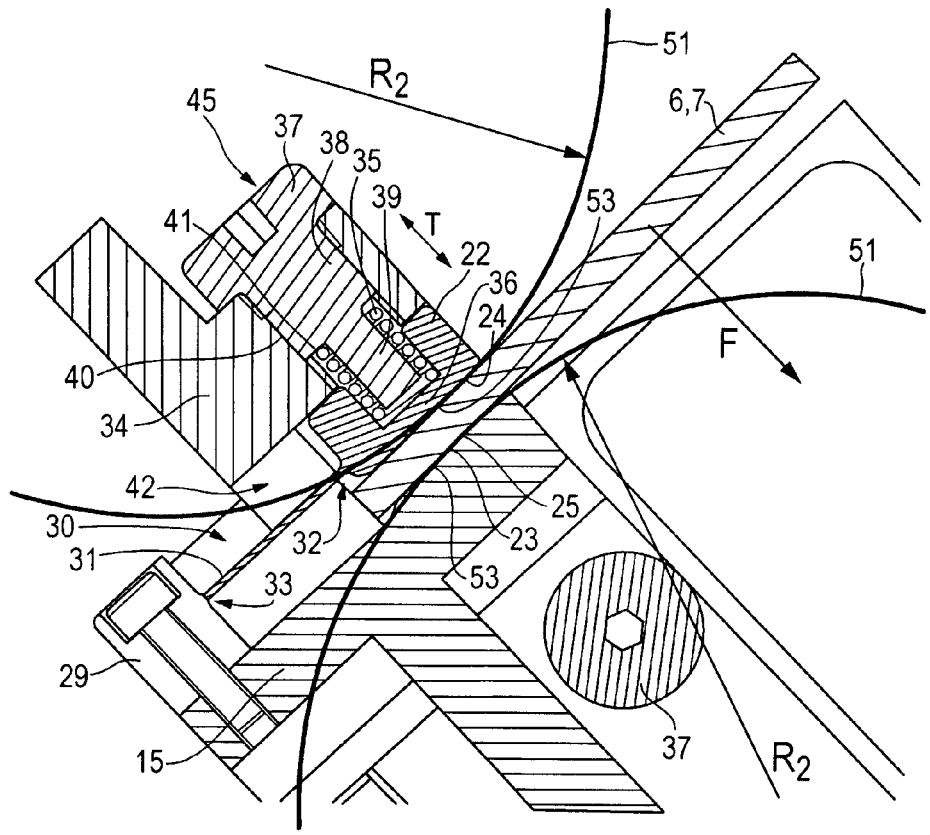
FIG. 6 depicts in an enlarged cross-sectional view, perpendicular to the view of FIG. 5, of the clamping assembly in an embodiment of the invention, with the radius of curvature, in a second plane perpendicular to the first plane, of the two clamping surfaces of opposite clamps of the clamping assembly.
Figure 7:
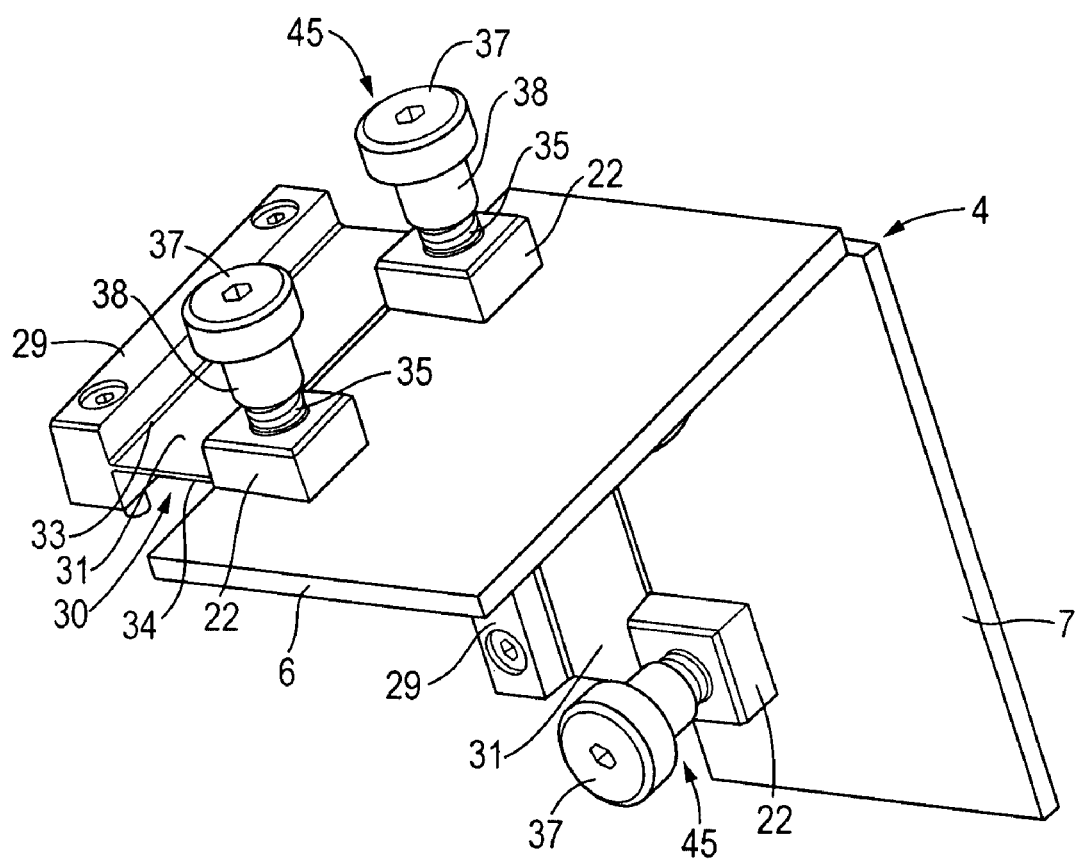
FIG. 7 in a perspective view schematically depicts first clamps of two clamping assemblies and two optical elements, showing guides for the first clamps.

Each first clamp 22 is connected to a holding bar 29 by a guide 30. In the embodiment shown, the guide 30 is in the form of a leaf spring 31, as is more clearly shown in FIGS. 6-10. The first clamps 22 of two clamping assemblies 20, 21 cooperate in holding one of the optical elements 6, 7 are fixedly connected to a first end 32 of the leaf spring 31, of which the opposite second end 33 is connected to the holding bar 29. The length of the leaf spring between the first and second ends 32, 33 is relatively large with respect to the thickness of the optical element 6, 7 and may be in the order of the distance between the first and second clamping assembly 20, 21. The guide 30, especially the spring 31 helps to ensure that the first clamps 22 can only move in a first direction T perpendicular to the opposite second clamping surface 25, whereas movement of the first clamps 22 in a direction perpendicular to the first direction T is constrained, i.e. prohibited, as will be shown later. FIG. 7 shows the first clamps 22 connected to the leaf spring 31 and locking pins 45, as well as locking bar 29.

Figure 5:
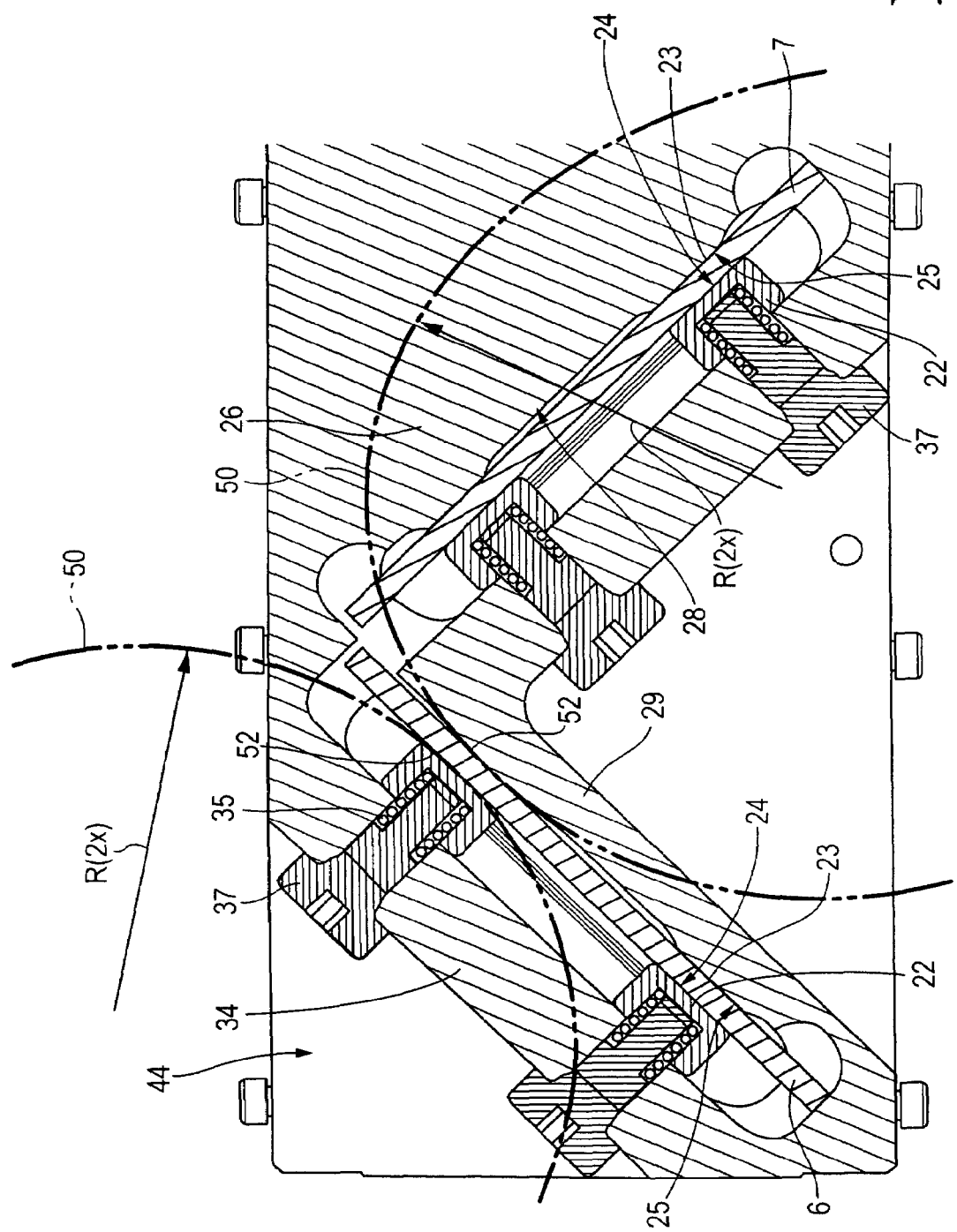
FIG. 5 depicts a cross-sectional view of part of an embodiment of the device of FIGS. 3 and 4, showing clamping assemblies clamping two optical elements, and the radius of curvature of first and second clamping surfaces, in a first plane, of two opposite clamps of one of the clamping assemblies.

A second support bar 34 is provided over the first clamps 22 on the side facing away from the second clamps 23. For each first clamp 22, a locking pin 45 extends through the second support bar 34 and is in contact with the first clamp through a spring 35, as shown in FIGS. 5 and 6. To this end, each first clamp 22 is provided with an indentation from the side opposite the first clamping surface 24, with a bottom 36 against which the spring 35 rests. The locking pin 45 is provided as a screw having a head 37 and a threaded shaft 38, partly narrowed, forming a shoulder 41. The narrowed part 39 is surrounded by the spring 35 such that when the screw 45, is screwed into a threaded opening 40 in the second support beam 34, the spring 35 is compressed between the shoulder 41 and the bottom 36. The leaf spring 31 extends through an opening 42 formed between the first and second support beams 26, 34 and through the support 15, and the holding bar 29 is connected to or near the back 16 of the support 15. The term "locking pin" is understood to encompass any element suitable for forcing the first clamping surface towards a surface of an object to be held, and may, for example, be a clamp or wedge, a mechanically locking element or hydraulic or pneumatic device.

Each first and second clamping surface 24, 25 is convex or cylindrical, such that a line of contact or a point of contact is provided when the first and second clamping surfaces 24, 25 are brought into contact with the first and second surfaces 18, 19 of the optical element 6, 7 respectively. Preferably the first and second clamping surfaces 24, 25 of any one clamping assembly 20, 21 are designed such that both provide either a line contact or a point contact.

Figure 4:
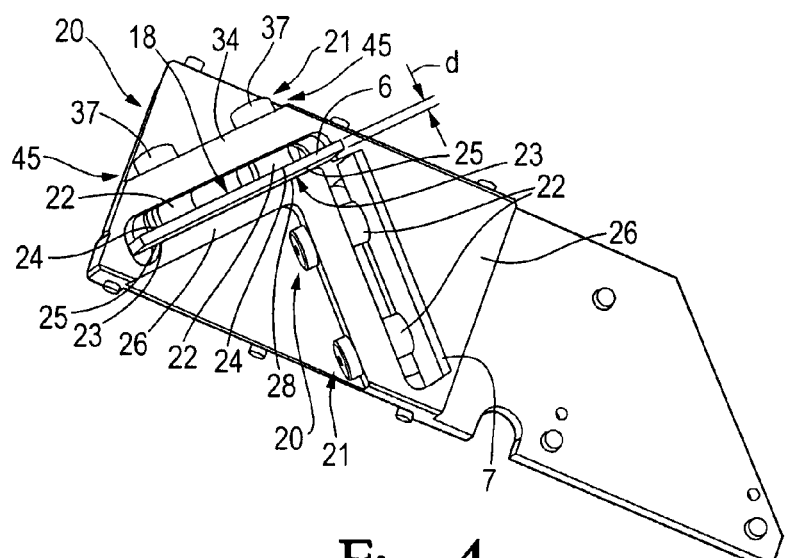
FIG. 4 is a another perspective view of the device of FIG. 3.

As is shown in FIGS. 3-5, the first holding bar 29 of a first set 44 of clamping assemblies 20, 21 is connected to the second support bar 34 and vice versa. The second clamps 23 are positioned against the second surfaces 19 of the optical elements 6, 7, which form the surface onto which the light beam 3A or the beam part 3C falling through the first optical element 6 fall.

As is shown in FIG. 3, the optical elements are flat, relatively thin semi transparent mirrors. Semi transparent has to be understood that part of a light beam having a specific wave length or spectrum will pass the mirror whereas most of the remaining beam will be reflected. This will be apparent to a person skilled in the art. By way of example only, a specific embodiment will be described in more detail, which is in no way to be considered as limiting the scope of the present invention.

In the embodiments shown by way of example only, the optical elements 6, 7 are made of $CaF_2$, which is fragile, having a thickness d of 3 mm, a length of 74 mm and a width (measured perpendicular to a side enclosed by the clamping device) of 56 mm. The elements 6, 7 have a hardness Knoop of 1.5 MPa and rupture strength of 36.5 MPa within the splitter 5. The leaf springs 31 have a stiffness, seen in direction T, of 25N/mm. The force exerted on each clamp is 35N. These values are given by way of example only, and should not be considered limiting the invention, and are approximations only.

A clamping device according to the present invention may be used as follows.

An optical element 6, 7 having a rectangular shape is slid in two clamping assemblies 20, 21, between the first and second clamping surfaces 24, 25. A first longitudinal side edge 46 of the optical element 6, 7 is positioned between the relevant pairs of first and second clamps 21, 22, leaving most of the further surfaces 18, 19 of the optical elements extending free from the clamping assemblies 20, 21. Then, the locking pins 45 are brought into position by screwing the pins 45 into the relevant openings 40 in the support beam 34. The springs 35 are compressed and the first clamping surfaces 24 are forced against the first surface 18 of the optical element 6, 7. Preferably the locking pins 45 and springs 35 are designed so that when the head 37 abuts the surface of the support 15, the force exerted by the spring onto the first clamp has the desired, predetermined value. Then, four friction surfaces are obtained between the clamping assemblies 20, 21 and each optical element 6, 7, between the first and second clamping surfaces 24, 25 and the first and second surfaces 18, 19 of the optical element 6, 7 respectively.

The clamping force F that can be applied on the surface 18, 19 of a fragile optical element 6, 7 without damaging or deforming the optical element 6, 7 may be limited because of strong increasing Hertz contact stresses between the clamping surfaces and the optical element. In order to prevent movement of the optical element at relatively high accelerations and decelerations, such as might occur with shocks, the friction force $F_w$ between the relevant surfaces should be high enough. This may be computed by:

$$Fw = F \cdot \mu \quad [1]$$

wherein:

F is the clamping force; and $\mu$ is the friction coefficient between the relevant surfaces (24, 18; 25, 19).

The total friction force to be exerted on the optical element is:

$$Fw_{total} \geq G_{(eff)} \cdot m_{optic} \cdot g \quad [2]$$

wherein:

$Fw_{total}$ is the total friction force exerted;

$G_{(eff)}$ is the effective acceleration (G) on the optical element;

$m_{optic}$ is the mass of the optical element; and g=gravitational acceleration.

By increasing the number of friction surfaces the clamping force necessary for preventing movement of the optical element, according to the present invention, it has been shown that the clamping force necessary can be reduced. This can be calculated by:

$$F = Fw/(\mu \cdot n) \quad [3]$$

wherein n is the number of friction surfaces, contact surfaces between clamps and one optical element.

In a clamping device according to the present invention as disclosed in FIGS. 3-7, four of such friction surfaces are provided, i.e. the first and second clamping surfaces 24, 25 of the first and second clamp 22, 23. This means that by a clamping device according to the invention, with a maximum allowable clamping force F to the surfaces 18, 19 of an optical element 6, 7 the optical element 6, 7 may be secured in position and resist larger accelerations than in ordinary clamping devices.

In FIG. 3, an outer cover or container 60 is schematically shown in dash-dotted lines that fully enclose the clamping device 5 that includes the optical elements 6, 7. In the embodiment shown the container 60 is in the form of a plastic bag, which is closed gas tight, for example, by sealing or a zip-lock, and filled with a protective gas atmosphere, such as an inert gas. The container 60 may also be a more rigid container, for example, a plastic box or a plasticized cardboard box or envelope. In this container, the device 5 may be sent to, for example, a user of an apparatus in which the device is to be used, or back to a supplier for maintenance.

Because the guides 30, i.e. the leaf springs 31, prevent movement of the first clamps 22 relative to the support bars 26, 34 in any direction parallel to the first and second surfaces 18, 19 of the optical element 6, 7, but allow movement in the first direction T and some angular movements, the first and second clamping surfaces 24, 25 may be brought into full contact with the first surface 18 of the optical element, whereas the second clamping surface will be brought into full contact with the opposite second surface 19 thereof. Therefore, each of the clamping surfaces will act as a friction surface.

In the embodiments shown in FIGS. 3-9, the optical elements are clamped in the side edge 46, thereby leaving the opposite side 4 of the beam splitter 5 free from further constructive elements. This results in a very compact and robust clamping device in which the optical elements may be easily positioned and fixed.

Figure 8A:
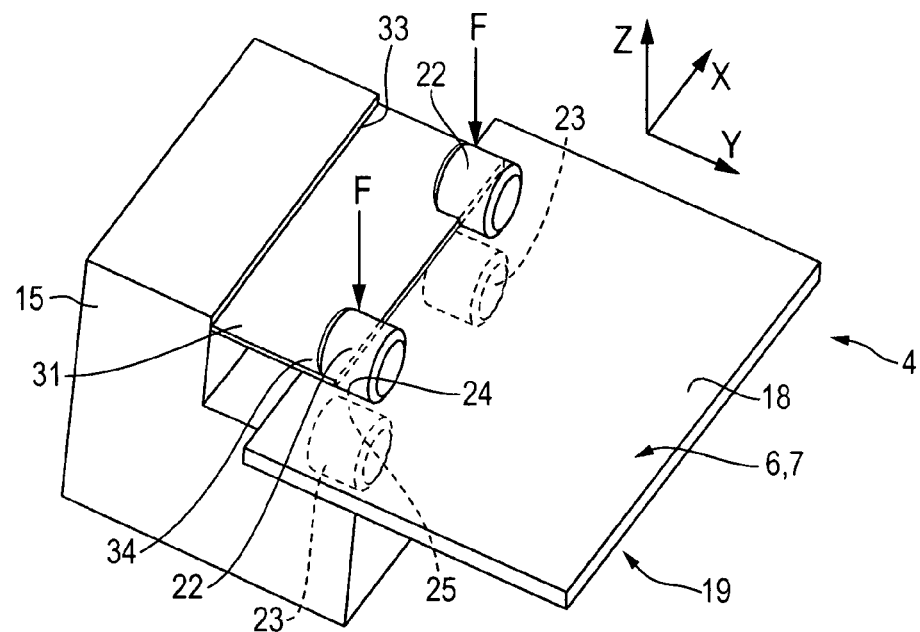
FIGS. 8A and B schematically depict in perspective view and in side view an embodiment of a clamping assembly using cylinders and parts thereof for the first and second clamps of a first and second clamping assembly holding one optical element.

In FIGS. 8A and B, an embodiment of a clamping device is shown in which the first and second clamps 22, 23 of the first and second clamping assembly 20, 21 are both formed such that they have a first and second clamping surfaces respectively formed by part of a cylinder. The first and second clamps 20, 21 are drawn as full cylinders and half cylinders respectively. The longitudinal axis H of these (half) cylinders extend parallel to each other. This results in four line contact surfaces. Directions X, Y and Z have been shown in FIG. 8. In this embodiment the construction is very compact and gives a high Rx-stiffness with low to no deformation induced.

Figure 8B:
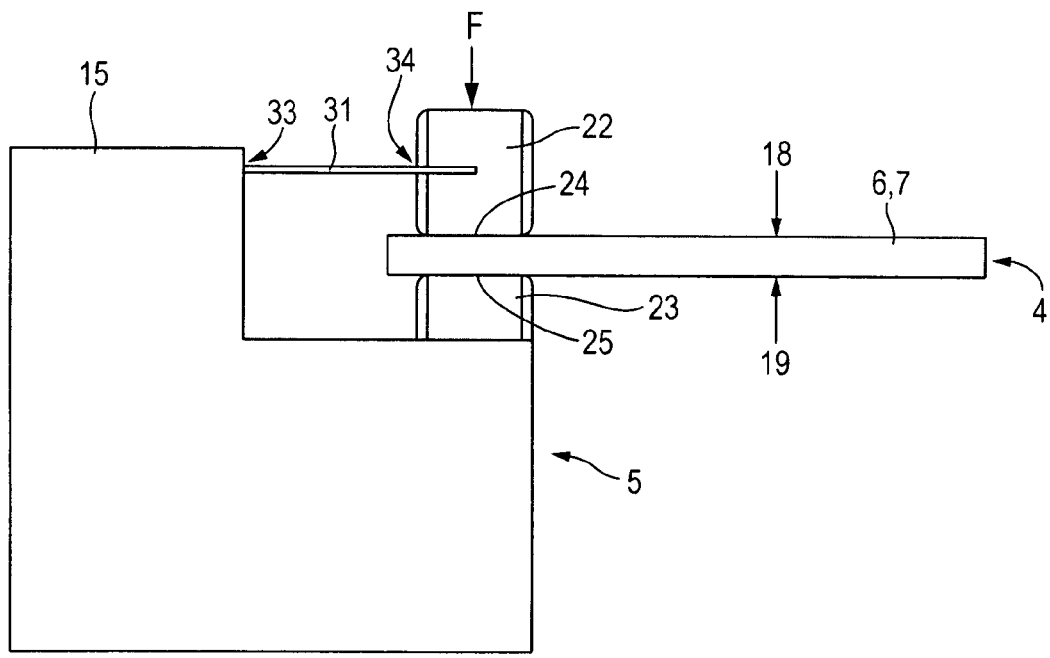
Figure 9A:
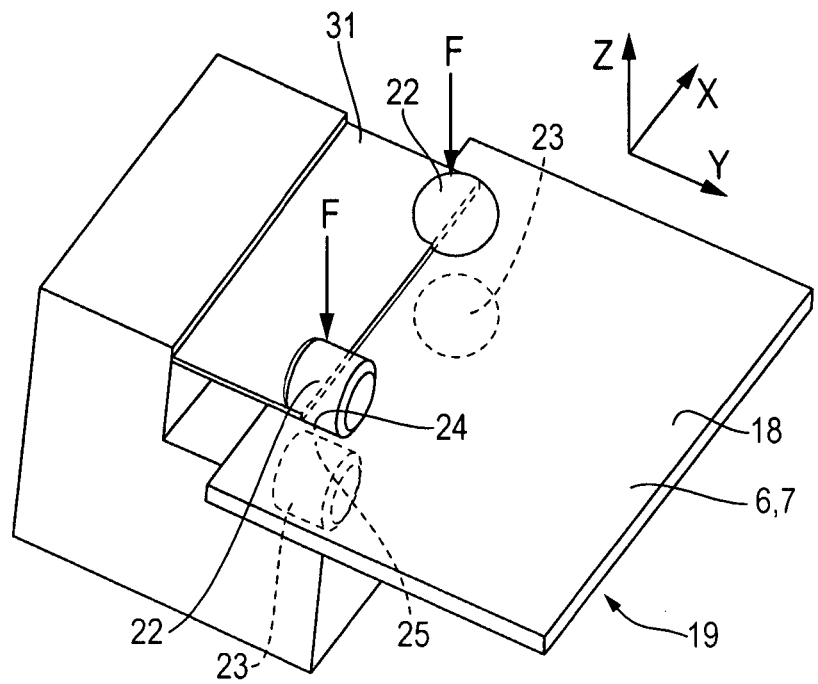
FIGS. 9A and B schematically depict in perspective view and in frontal view an embodiment of a clamping assembly using a cylinder for the first and second clamp of a first clamping assembly and spheres for the first and second clamp of a second clamping assembly, holding one optical element.
Figure 9B:
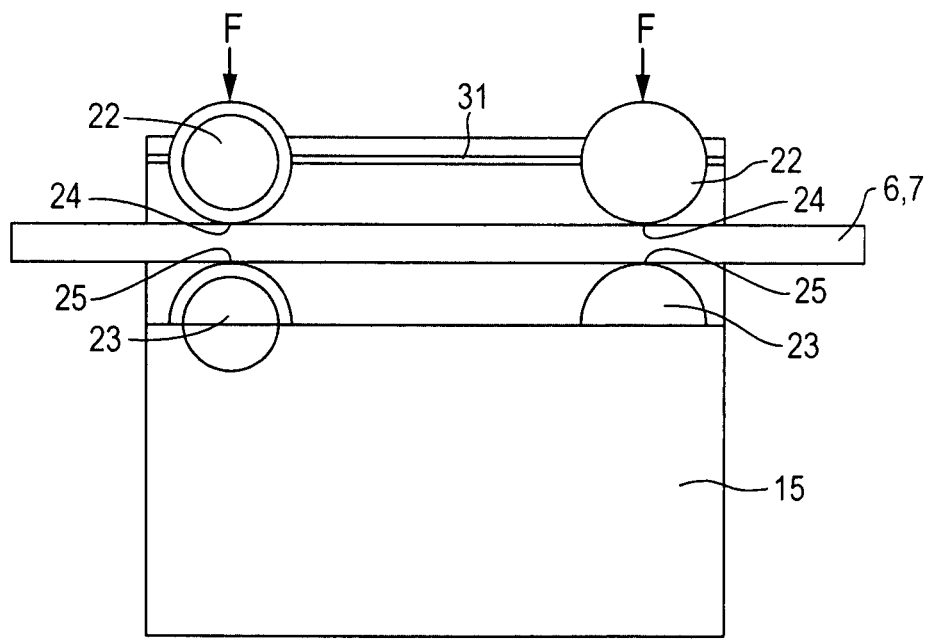

In FIGS. 9A and B, an embodiment of a clamping device is shown in which the first and second clamp 22, 23 of the first clamping assembly 20 are formed such that they have a first and second clamping surface respectively formed by part of a cylinder. The first and second clamp 22, 23 are drawn as full cylinder and half cylinder respectively. The longitudinal axis H of these (half) cylinders extend parallel to each other. Of the second clamping assembly 21, the first and second clamping surface are provided by two spherical surfaces. In FIG. 9, these are drawn as (half) spheres. This results in two line contact surfaces and two point contact "surfaces". Directions X, Y and Z have been shown in FIG. 9. In this embodiment, the construction is very compact and gives a high Rx-stiffness with low to no deformation induced. The Rx stiffness of this embodiment is half of the Rx stiffness of the embodiment of FIG. 8, since this is now applied with only one pair of cylinders.

Figure 10A:
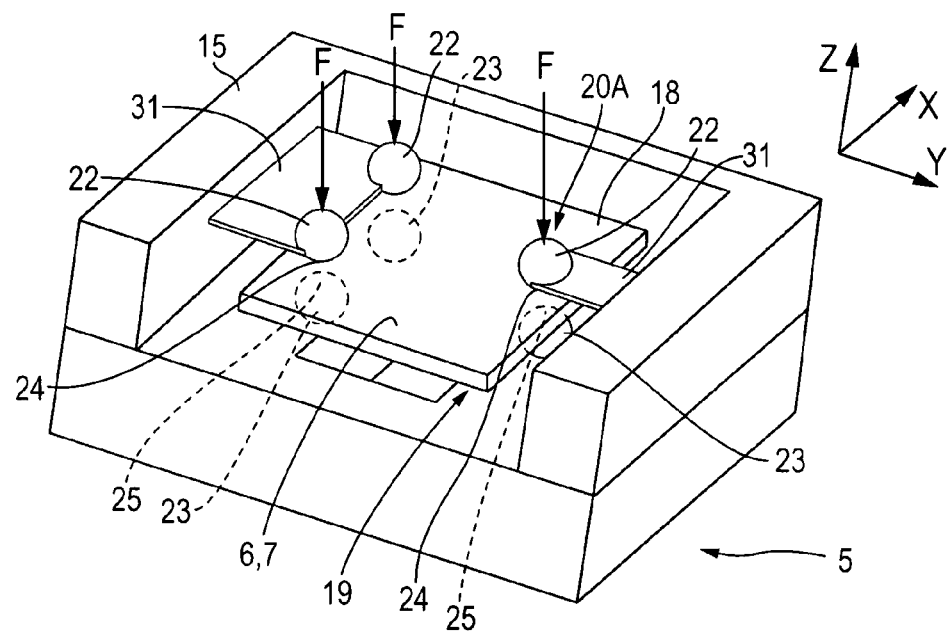
FIGS. 10A and B schematically depict in perspective view and in side view an embodiment of a clamping assembly using three clamping assemblies holding one optical element, each clamping assembly having a sphere forming a first and second clamp, respectively, of each of the clamping assemblies.
Figure 10B:
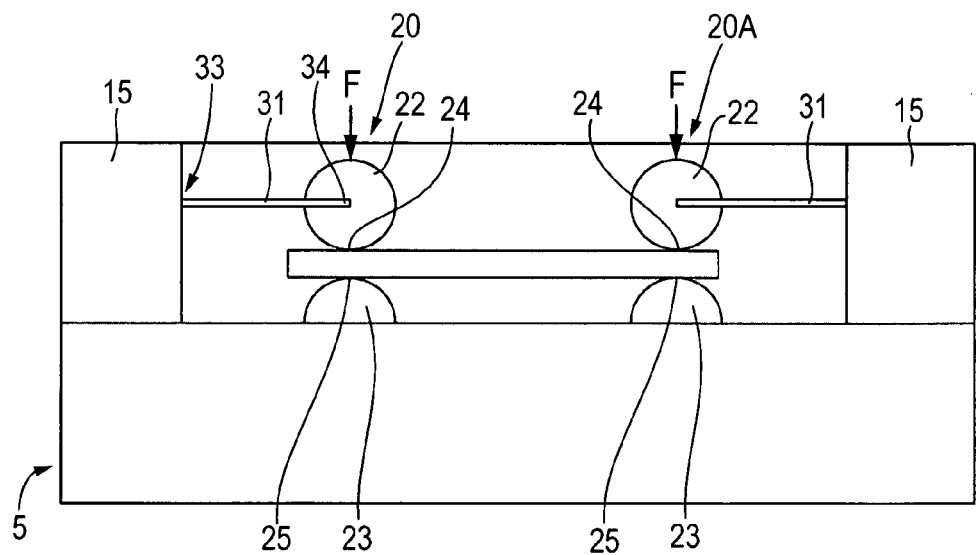

In FIGS. 10 A and B, an embodiment of a clamping device is shown in which three clamping assemblies are provided, two of which are configured as described before, in which the clamping surfaces are spherical. On the opposite second side 4, a further clamping assembly 20A is provided that has first and second clamps 22, 23 that have first and second clamping surfaces 24, 25 provided by two spherical surfaces. This results in six point contact "surfaces". Directions X, Y and Z have been shown in FIG. 10A. In this embodiment, the construction is very compact and gives a high Rx-stiffness with low to no deformation being induced. The number of contact surfaces is increased to six, thereby reducing the clamping force and/or increasing the resistance against movement.

Figure 11:
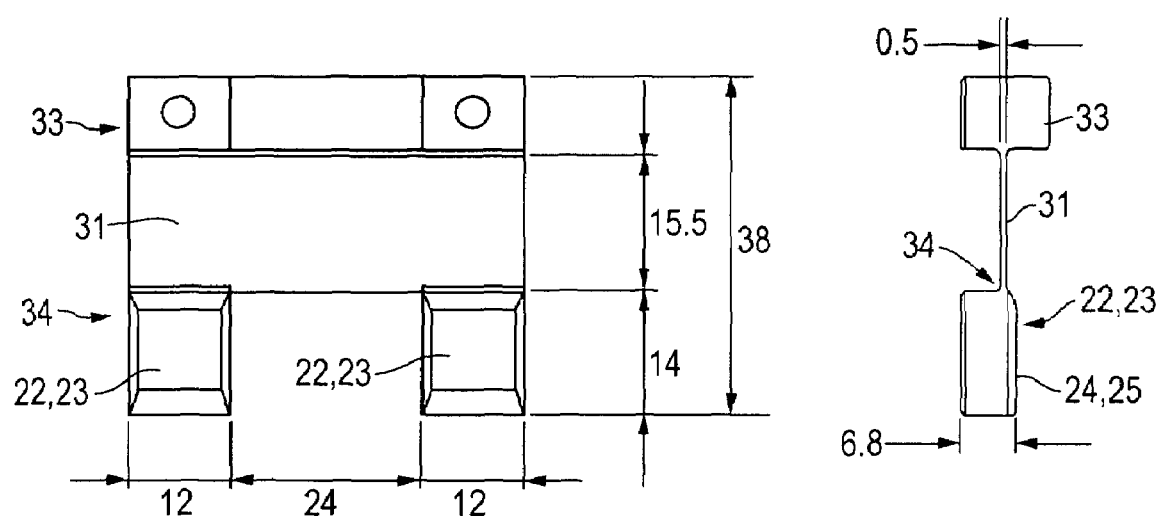
FIG. 11 in top and side view depicts a spring leaf and clamping elements for use in a device as shown in any one of the preceding drawings that is integrally made.

FIG. 11 shows an example of the leaf spring 31 with clamping elements 22 or 23, integrally made with an end 33 for mounting in the housing 15, with possible sizes referenced in mm. These should not be considered to limit the invention in any way. The assembly is preferably made of metal but may be made of plastic.

In the embodiment described before by way of example, an embodiment similar to FIG. 8 is used, which provides a shock resistance to accelerations and decelerations up to at least 30G. A clamping device according to the present invention may be used for both mounting optical elements into apparatus such as lithographic apparatus shown in FIG. 1, in units 1 as shown in FIG. 2, or in other contraptions. Moreover, a clamping device according to the present invention may be used for packaging and shipping optical elements to, for example, customers. The device may then be readily employed in any apparatus it is intended for by direct mounting of the device. This may accelerate, for example, maintenance, thereby minimizing the risk of faulty positioning and minimizing the risk of damage to the optical elements.

In a device according to the present invention, an optical element may be clamped in a non-deformed state. A non-deformed state is understood to mean that any angular deformation within such optical element induced by or resulting from the clamping is less than about 250 µRad, more preferably less than about 100 µRad and most preferably less than about 25 µRad. A line contact surface is understood to be a contact area having a longitudinal direction that is substantially longer than a width direction perpendicular to the longitudinal direction, such that the area has a long, narrow shape and preferably of a line. A point contact surface is understood to be a surface that has a substantially circular shape with a relatively small radius, compared to the outer dimensions of the relevant clamp and optical element, especially a point shaped area.

In FIGS. 5 and 6, circles 50 and 51 (or at least parts thereof) are drawn in along parts 52, 53 of the first and second contact surfaces 24, 25 of the first and second clamps 22, 23, in front and side view. The radius $R_1$, $R_2$ of at least the parts 52, 53 are optimized such that the Hertz contact stresses are minimized, or at least outside a range in which such stress would lead to damage to the optical element, especially to the first and/or second surface 18, 19 thereof. The first and second clamping surfaces 24, 25 have, when they are elongated in one direction, such as cylindrical or part thereof, chamfered of preferably rounded of at both longitudinal ends 55, not visible in pictures, in order to further reduce stresses which could be due to the clamping forces F.

Figure 6A:
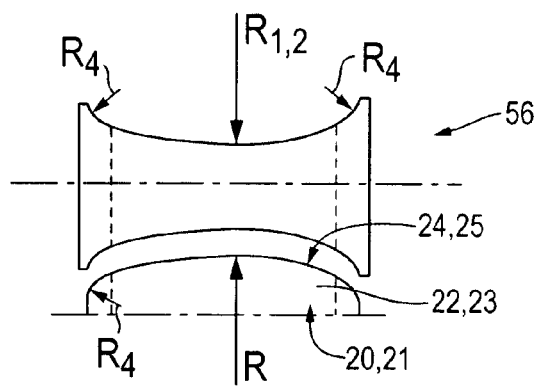
FIG. 6A depicts an embodiment of manufacturing of the contact surfaces of the clamps with an electrode.

As is shown in enlarged view in FIG. 6A, the first and second surfaces 24, 25 may be made by abrasive technique, for example, by spark machining using a specially designed, rotational symmetrical electrode 56 having a surface cross section complimentary to the relevant first or second clamping surface. The middle part, not visible in the figures, has a curvature with a radius $R_{1,2}$ complementary to that of the clamping surface part 52, 53, whereas the ends are rounded with a smaller radius $R_4$. Preferably, a cylindrical electrode is used that may be rolled over the first or second clamp for providing the desired clamping surfaces. Such an electrode 56 is schematically shown in FIG. 6A, in side view.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

A device 5 according to the present invention may be designed to hold less or more than two optical elements and may be used for holding other optical elements such as lenses. It may be used in other apparatus such as development apparatus for films.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to transfer a pattern from a patterning device onto a substrate, the apparatus comprising:

an optical element, and at least two clamping assemblies constructed and arranged to clamp said optical element, said clamping assemblies each comprising a first clamp with a first clamping surface in contact with a first surface of said optical element and a second clamp with a second clamping surface in contact with a second surface of said optical element, said second surface being on a side of the optical element opposite said first surface;

a support connected to said first clamp and said second clamp so that said first and second clamps are positioned facing each other with the optical element disposed between the first clamp and the second clamp;

a first guide constructed and arranged to connect said first clamp to said support and to allow said first clamp to move in a first direction substantially perpendicular to said first surface of said optical element and to constrain said first clamp against movement in directions perpendicular to said first direction, even when said first clamp is forced against said optical element; and a plurality of locking members constructed and arranged to force said first clamping surface of said first clamp against said first surface of said optical element, and said second clamping surface of said optical element against the opposing second surface of said second clamp.

2. A lithographic apparatus according to claim 1, wherein of said first and second clamping assemblies, the first clamps and second clamps are all connected to a common support.

3. A lithographic apparatus according to claim 1, wherein said first guide comprises a flexible connecting strip, and wherein said first clamp is connected to a second support by said flexible connecting strip, said strip being more flexible in said first direction than in each direction perpendicular to said first direction.

4. A lithographic apparatus according to claim 3, wherein said strip is a leaf spring.

5. A lithographic apparatus according to claim 1, wherein said first and second clamping surfaces comprise a cylindrical or spherical surface part in contact with said optical element.

6. A lithographic apparatus according to claim 1, wherein said locking members are spring loaded in said first direction.

7. A lithographic apparatus according to claim 1, wherein said optical element is provided in a pulse stretcher.

8. A lithographic apparatus according to claim 7, wherein said pulse stretcher is provided in a pulse stretching module.

9. A lithographic apparatus according to claim 1, wherein said optical element is a lens or mirror made of $CaF_2$.

10. A lithographic apparatus according to claim 1, wherein said first surface of said optical element is facing away from a side of said optical element that is constructed and arranged to receive a radiation beam.

11. A lithographic apparatus according to claim 1, wherein said optical element has a central portion and an outer edge, wherein two clamping assemblies are provided at said outer edge, to one side of said central portion.

12. A lithographic apparatus according to claim 11, wherein said optical element has a substantially rectangular outer edge, said clamping assemblies being provided at one side of said outer edge.

13. A lithographic apparatus according to claim 1, further comprising:

an illumination system configured to condition a radiation beam;

a support constructed to support the patterning device, the patterning device being configured to impart the radiation beam with a pattern in its cross-section to form a patterned radiation beam;

a substrate table constructed to hold the substrate; and a projection system configured to project the patterned radiation beam onto a target portion of the substrate, wherein said optical element is provided in a beam delivery system for guiding said radiation beam.

14. An apparatus comprising an optical element, said optical element being clamped by at least two clamping assemblies constructed and arranged to clamp said optical element, said clamping assemblies each comprising a first clamp with a first clamping surface in contact with a first surface of said optical element and a second clamp with a second clamping surface in contact with a second surface of said optical element, said second surface being on a side of the optical element opposite said first surface;

a support connected to said first clamp and said second clamp so that said first and second clamps are positioned facing each other with the optical element disposed between the first clamp and the second clamp;

a first guide constructed and arranged to connect said first clamp to said support and to allow said first clamp to move in a first direction substantially perpendicular to said first surface of said optical element and to constrain said first clamp against movement in directions perpendicular to said first direction, even when said first clamp is forced against said optical element; and a plurality of locking members constructed and arranged to force said first clamping surface of said first clamp against said first surface of said optical element, and said second clamping surface of said optical element against the opposing second surface of said second clamp.

15. An apparatus according to claim 14, wherein of said first and second clamping assemblies, the first clamps and second clamps are connected to a common support.

16. An apparatus according to claim 14, wherein said first guide comprises a flexible connecting strip, and wherein said first clamp is connected to a second support by said flexible connecting strip, said strip being more flexible in said first direction than in each direction perpendicular to said first direction.

17. An apparatus according to claim 16, wherein said strip is a leaf spring.

18. An apparatus according to claim 14, wherein said first and second clamping surfaces comprise a cylindrical or spherical surface part in contact with said optical element.

19. An apparatus according to claim 14, wherein said locking members are spring loaded in said first direction.

20. An apparatus according to claim 14, wherein said optical element is provided in a pulse stretcher.

21. An apparatus according to claim 20, wherein said pulse stretcher is provided in a beam delivery system.

22. An apparatus according to claim 14, wherein said optical element is a lens or mirror made of $CaF_2$.

23. An apparatus according to claim 14, wherein said first surface of said optical element is facing away from a side of said optical element that is constructed and arranged to receive a radiation beam.

24. An apparatus according to claim 14, wherein said optical element has a central portion and an outer edge, wherein two clamping assemblies are provided at said outer edge, to one side of said central portion.

25. A clamping device for an optical element, said clamping device comprising at least two clamping assemblies constructed and arranged to clamp said optical element, said clamping assemblies each comprising a first clamp with a first clamping surface in contact with a first surface of said optical element and a second clamp with a second clamping surface in contact with a second surface of said optical element, said second surface being on a side of the optical element opposite said first surface;

a support connected to said first clamp and said second clamp so that said first and second clamps are positioned facing each other with the optical element disposed between the first clamp and the second clamp;

a first guide constructed and arranged to connect said first clamp to said support and to allow said first clamp to move in a first direction substantially perpendicular to said first surface of said optical element and to constrain said first clamp against movement in directions perpendicular to said first direction, even when said first clamp is forced against said optical element; and a plurality of locking members constructed and arranged to force said first clamping surface of said first clamp against said first surface of said optical element, and said second clamping surface of said optical element against the opposing second surface of said second clamp.

26. A clamping device according to claim 25, wherein of said first and second clamping assemblies, the first clamps and second clamps are connected to a common support.

27. A clamping device according to claim 25, wherein said first guide comprises a flexible connecting strip, and wherein said first clamp is connected to a second support by said flexible connecting strip, said strip being more flexible in said first direction than in each direction perpendicular to said first direction.

28. A clamping device according to claim 27, wherein said strip is a leaf spring.

29. A clamping device according to claim 25, wherein said first and second surfaces comprise a cylindrical or spherical surface part.

30. A clamping device according to claim 25, wherein said locking members are spring loaded in said first direction.

31. A clamping device according to claim 25, wherein said clamping device is part of a pulse stretcher.

32. A clamping device according to claim 31, wherein said pulse stretcher is provided in a beam delivery system.

33. A clamping device according to claim 25, wherein a position for an optical element is provided and said clamping assemblies are provided next to each other to one side of said position to hold said optical element in said position.

34. A clamping device according to claim 25, wherein at least two sets of at least two clamping assemblies are provided, positioned relative to each other such that in each set of clamping assemblies, a substantially flat optical element is or can be provided, each optical element having an optical center line, said center lines of at least two of said optical elements including an angle.

35. A clamping device according to claim 34, wherein said angle is between 1 and 179 degrees.

36. A clamping device according to claim 35, wherein said angle is between 30 and 150 degrees.

37. A clamping device according to claim 36, wherein said angle is between 60 and 120 degrees.

38. A method for manufacturing a device comprising an optical element for an apparatus, said method comprising:

clamping said optical element with at least two clamping assemblies, each clamping assembly comprising a first clamp with a first clamping surface which is brought into contact with a first surface of said optical element and a second clamp with a second clamping surface which is brought into contact with a second surface of said optical element, said second surface being on a side of the optical element opposite said first surface;

connecting said first clamp to a support with a first guide such that said first clamp can move in a first direction substantially perpendicular to said first surface of said optical element but is constrained against movement in directions perpendicular to said first direction, even when said first clamp is forced against said optical element; and forcing locking members against said first clamp to force said first clamping surface of said first clamp against said first surface of said optical element and said second surface of said optical element against the opposing second clamping surface of said second clamp.

39. A method according to claim 38, wherein said clamping assemblies are provided in a unit which is releasably connected to said apparatus, wherein said optical element is provided in said clamping assemblies prior to positioning said unit in said apparatus.

40. A method according to claim 39, wherein said unit including said at least one optical element is replaced by a similar unit comprising an optical element.

41. A unit for providing a light beam, comprising: a light source and a pulse stretcher, said pulse stretcher comprising an optical element for deflecting at least part of a light beam provided by said light source, said optical element being clamped in a clamping device comprising at least two clamping assemblies constructed and arranged to clamp said optical element, said clamping assemblies each comprising a first clamp with a first clamping surface in contact with a first surface of said optical element and a second clamp with a second clamping surface in contact with a second surface of said optical element, said second surface being on a side of the optical element opposite said first surface;

a support connected to said first clamp and said second clamp so that said first and second clamps are positioned facing each other with the optical element disposed between the first clamp and the second clamp;

a first guide constructed and arranged to connect said first clamp to said support and to allow said first clamp to move in a first direction substantially perpendicular to said first surface of said optical element and to constrain said first clamp against movement in directions perpendicular to said first direction, even when said first clamp is forced against said optical element; and a plurality of locking members constructed and arranged to force said first clamping surface of said first clamp against said first surface of said optical element, and said second clamping surface of said optical element against the opposing second surface of said second clamp.

42. A lithographic apparatus according to claim 1, wherein said locking members are locking pins.

43. An apparatus according to claim 14, wherein said locking members are locking pins.

44. A clamping device according to claim 25, wherein said locking members are locking pins.

* * * * *